United States Patent [19]
Wu

[11] Patent Number: 5,854,101
[45] Date of Patent: Dec. 29, 1998

[54] LOW MASK COUNT CMOS PROCESS WITH INVERSE-T GATE LDD STRUCTURE

[75] Inventor: Shye-Lin Wu, Hsinchu, Taiwan

[73] Assignee: Powerchip Semiconductor Corporation, Hsinchu, Taiwan

[21] Appl. No.: 825,720

[22] Filed: Apr. 4, 1997

[51] Int. Cl.$^6$ ............................................. H01L 21/8238

[52] U.S. Cl. ........................ 438/231; 438/227; 438/228; 438/230; 438/225

[58] Field of Search .................................. 438/199, 225, 438/227, 228, 230, 231

[56] References Cited

U.S. PATENT DOCUMENTS

| | | | |
|---|---|---|---|
| 5,731,214 | 3/1998 | Kurihara | 438/227 |
| 5,747,368 | 5/1998 | Yang et al. | 438/228 |
| 5,773,335 | 6/1998 | Chao | 438/199 |

*Primary Examiner*—Trung Dang
*Attorney, Agent, or Firm*—Christensen O'Connor Johnson & Kindness PLLC

[57] ABSTRACT

A CMOS process with inverse-T gate LDD structure uses liquid phase deposition (LPD) processes to achieve a low thermal budget with only six photoresist-masks in a CMOS device. A first photoresist-mask is used to form field oxide regions. A second photoresist-mask is used to implant a P-well. Before the second photoresist-mask is removed, a first LPD oxide layer is used to cover the N-well. The second photoresist-mask is removed, and the first LPD oxide layer is used as a mask for implanting the N-well. The first LPD oxide layer is removed and a polysilicon layer is deposited on the substrate. A third photoresist-mask is used to etch the polysilicon layer to form gate-structures for the NMOS and PMOS devices. A conformal amorphous Si layer is formed on the gate-structures, followed by forming a fourth photoresist-mask over the N-well. A conformal LPD oxide layer is formed on the conformal polysilicon layer over the P-well. N-LDD regions are then implanted. An anisotropic etch is performed to form spacers on the sidewalls of the P-well gate-structure. N$^+$ S/D regions are then implanted. Then, before the fourth photoresist-mask is removed, another LPD oxide layer is formed over the P-well to serve as a P-well mask. Spacers, P-LDD, P$^+$ S/D regions, and an inverse-T gate are then similarly formed for the PMOS device. The N-well is covered with another LPD oxide layer, which is then covered with a BPSG layer. Fifth and sixth photoresist-masks are then formed to create contacts from the conductive layer.

35 Claims, 6 Drawing Sheets

LOW MASK COUNT CMOS PROCESS WITH INVERSE-T GATE LDD STRUCTURE

FIELD OF THE INVENTION

The present invention relates to semiconductor processes and, more particularly, to methods for fabricating complementary metal-oxide-semiconductor (CMOS) devices. Still more particularly, the present invention relates to low mask count CMOS fabrication process using metal-oxide-semiconductor field effect transistors (MOSFETs) with an inverse-T gate lightly doped drain (LDD) structure.

BACKGROUND

The trend in CMOS technology is to use deep sub-micron devices to increase the integration of the CMOS devices. However, the complexity of these deep submicron devices has made manufacturing CMOS devices more difficult. Also, using conventional processes, forming a CMOS device with a LDD doping profile typically requires the formation of ten photoresist-masks. This relatively large mask count adds to the complexity of the LDD CMOS fabrication process.

In addition, as device dimensions are scaled down, a corresponding power reduction occurs and the latch-up and hot carrier effects become significant limitations for the deep sub-micron MOSFET devices. Further, conventional LDD structures generally have a relatively large resistance, which becomes problematic as the supply voltages for the LDD CMOS devices are lowered to reduce power dissipation. Furthermore, the location of the peak electric field in conventional LDD structures may shift so that negative charges are generated in the oxide above the n-drain region of the n-channel device of CMOS structure, resulting in increased series resistance in the n-drain region.

Still further, as the wafer is exposed to thermal processes, dopants in the wafer tend to diffuse. The diffusion of dopants is a highly controlled in LDD CMOS fabrication processes to achieve the LDD doping profile. Thus, it is generally desirable to minimize the thermal exposure of the wafer (commonly referred to as the thermal budget) to minimize unwanted diffusion.

In view of the above, the inventor of the present invention has appreciated a need for a less complex deep sub-micron LDD CMOS process with reduced resistance and low thermal budget.

SUMMARY

In accordance with the present invention, a method for fabricating a LDD CMOS device having low mask count and thermal budget is provided. In one embodiment of this process, $SiO_2$ liquid phase deposition (LPD) processes and inverse-T gate technologies are employed to reduce the mask count and thermal budget and minimize latch-up and channel hot carrier effects. In this embodiment, standard techniques and a first photoresist-mask are used to provide a semiconductor substrate with field oxide (FOX) regions for isolating devices and a thin pad oxide layer between the FOX regions. Then a nitride layer is formed over the FOX regions and thin pad oxide layer.

A second photoresist-mask is formed over a portion of the substrate to define a P-well. Then, a high energy boron ion implantation is performed to form a retrograde P-well. A thick oxide film is then formed over the P-well by liquid phase deposition (LPD) process oxide without removing the first photoresist-mask. The second photoresist-mask is then removed, leaving the thick LPD oxide layer intact. A high energy phosphorous ion implantation is then performed using the LPD oxide as an implant mask, forming a retrograde N-well. The thick LPD oxide film is then removed, with the thin nitride film serving as a protective layer for the FOX regions and the thin pad oxide layer. Next, the thin nitride film and the pad oxide films are removed, followed by a thin gate oxide growth process. Then, a blanket deposition of undoped poly-Si is performed.

A third photoresist-mask is then formed on the undoped poly-Si layer to define poly-Si gate-structures over each well. Then a blanket deposition of a thin undoped α-Si film is performed. This thin α-Si film is conformal over the poly-Si gate-structures.

A fourth photoresist-mask is then formed over the N-well and a phosphorus ion implantation is performed into the P-well. The poly-Si gate-structure and the α-Si film serve as an implant mask This implant forms a lightly doped region for the N-LDD junctions between the FOX regions and the sidewalls of the α-Si covered poly-Si gate-structure over the P-well. Then a thin LPD oxide film is formed over the P-well and adjacent to the fourth photoresist-mask over the N-well.

An etching back process is then performed on the thin LPD oxide and α-Si films left uncovered by the fourth photoresist-mask, thereby forming a spacer along the sidewalls of the poly-Si gate-structure over the P-well. More specifically, these spacers are disposed on residual α-Si portions left on the sidewalls of the poly-Si gate-structure. The α-Si portions have a vertical portion along the sidewall of the poly-Si gate-structure and a small horizontal portion extending outwardly from the sidewall of the poly-Si gate-structure. The poly-Si gate-structure and the α-Si portions form an inverse-T gate electrode for the NMOS device. A high dose As+ implantation is then performed into the P-well to form N+ source/drain (S/D) junctions between the FOX regions and the spacers, using the fourth photoresist-mask, the FOX regions, the poly-Si gate-structure, the residual α-Si portions on the sidewalls of the gate-structure, and the spacers as an implant mask.

A LPD oxide layer is then formed over the P-well adjacent to the fourth photoresist-mask. The fourth photoresist-mask is then removed, leaving the LPD oxide layer over the P-well intact. This LPD oxide layer serves as an implant mask for a subsequent boron implantation to form a P-LDD junction in the N-well. An etching back process is then performed on the now exposed thin LPD oxide and α-Si film over the N-well, forming an oxide/α-Si spacer around the poly-Si gate-structure over the N-well. The residual α-Si film and the poly-Si gate-structure form an inverse-T gate electrode for the PMOS device. A high dose $BF_2^+$ implantation is performed in the N-well to form P+ S/D junctions between FOX regions and the spacers, using the LPD oxide layer, the FOX regions, the poly-Si gate-structure, the residual α-Si portions on the sidewalls of the gate-structure, and the spacers as an implant mask.

Afterward, another LPD oxide layer is formed over the N-well and adjoining the LPD oxide layer over the P-well. A borophosphosilicate glass (BPSG) layer is then deposited over the LPD oxide layers over the P-well and N-well. Then a moderate thermal cycle is performed to reflow the BPSG layer and drive-in the dopants to form S/D junctions.

A fifth photoresist-mask is then formed to define S/D contact windows. The S/D contact windows are opened by dry etching. A conductive layer is then deposited over the BPSG layer, filling the contact holes.

A sixth photoresist-mask is then formed to define the contacts. Because LPD oxide layers are used to replace several photoresist-masks (if using conventional CMOS processes), alignment is improved while the complexity and thermal budget of the fabrication process are significantly reduced, compared to conventional CMOS fabrication processes. Further, the residual poly-Si and α-Si layers over each well form an inverse-T gate-structure. More specifically, the residual α-Si layer over the P-well provides a small drain-to-gate overlap to ensure that the location of the peak electric field remains under the gate electrode, thereby eliminating the increase in resistance that can occur using other conventional gate electrode shapes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
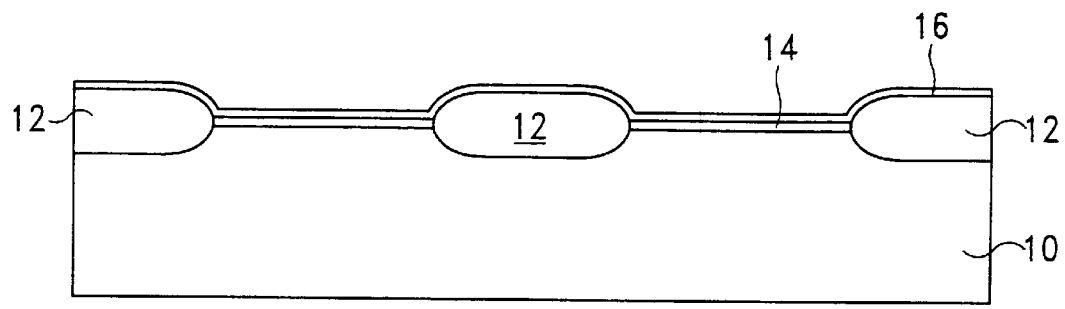
FIGS. 1–12 are cross-sectional views of a semiconductor wafer illustrating various stages of forming a CMOS structure according to one embodiment of the present invention.

In accordance with one embodiment of the present invention, FIG. 1 shows a schematic cross-section of wafer at an initial stage in forming a CMOS device. A silicon substrate 10 has formed thereon isolation regions 12, a silicon dioxide layer 14, and a thin nitride layer 16. In this embodiment, the isolation regions 12 are thick field oxide (FOX) regions formed to provide isolation between devices on the substrate 10. The FOX region 12 is created in a conventional manner using a first photoresist-mask. For example, the first photoresist-mask is used to pattern a nitride layer formed on the substrate 10, with FOX regions defined at the portions of the substrate 10 left uncovered by the nitride. The portions of the substrate 10 left exposed by the nitride are then subjected to thermal oxidation in an oxygen-steam environment to grow the FOX regions 12. Typically, the FOX regions 12 have a thickness of about 3000–8000 angstroms.

After the FOX regions 12 are formed, the silicon dioxide layer 14 is created on the top of surface of the substrate to serve as a passivation layer. In this embodiment, the silicon dioxide layer 14 is formed by using an dry $O_2$, wet $O_2$, or $N_2+O_2$ ambient, at a temperature of about 700°–1100° C. Alternatively, the oxide layer 14 may be formed using any suitable oxide chemical compositions and procedures. In this embodiment, the silicon dioxide layer 14 is formed to a thickness of approximately 30–200 angstroms. The oxide layer 14 and the FOX regions 12 are then covered with the nitride layer 16, which protects the FOX regions in oxide removal process steps. In this embodiment, the silicon nitride layer 16 is formed using a conventional low pressure chemical vapor deposition (LPCVD) process or plasma-enhanced chemical vapor deposition (PECVD) process. In this embodiment, the nitride layer 16 has a thickness of about 300–500 angstroms, although any thickness in the range of about 100–2000 angstroms can be used.

Figure 2:
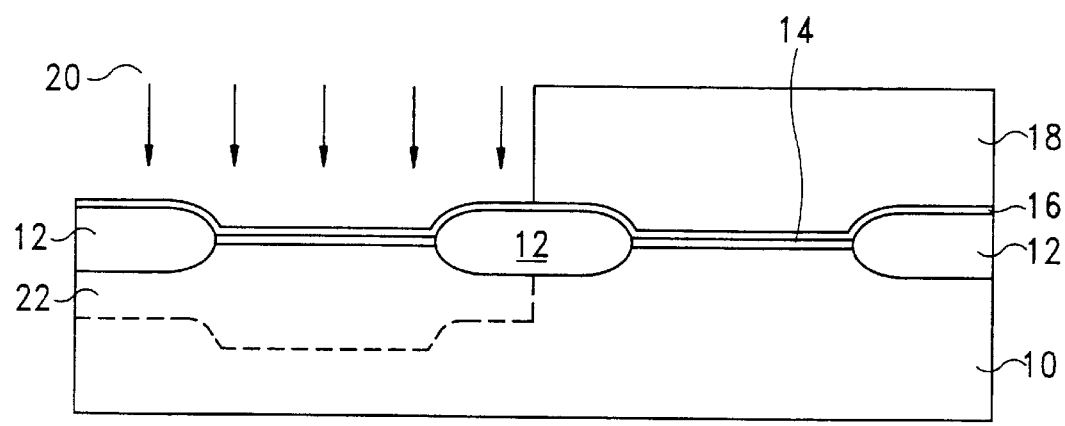

FIG. 2 shows the resulting structure after implanting boron ions to form a P-well 22. A second photoresist layer 18 is formed on the nitride layer 16 and then patterned using standard photoresist coating, exposure and development processes to define a P-well region between two FOX regions. Boron ions 20 are then implanted using the photoresist layer 18 as an implant mask, thereby forming the retrograde P-well 22. In this embodiment, a high energy boron implant process is performed using a dosage of about $1\times10^{11}$–$5\times10^{13}$ ions/cm$^2$ and an implant energy of about 500 KeV–3000 KeV.

Figure 3:
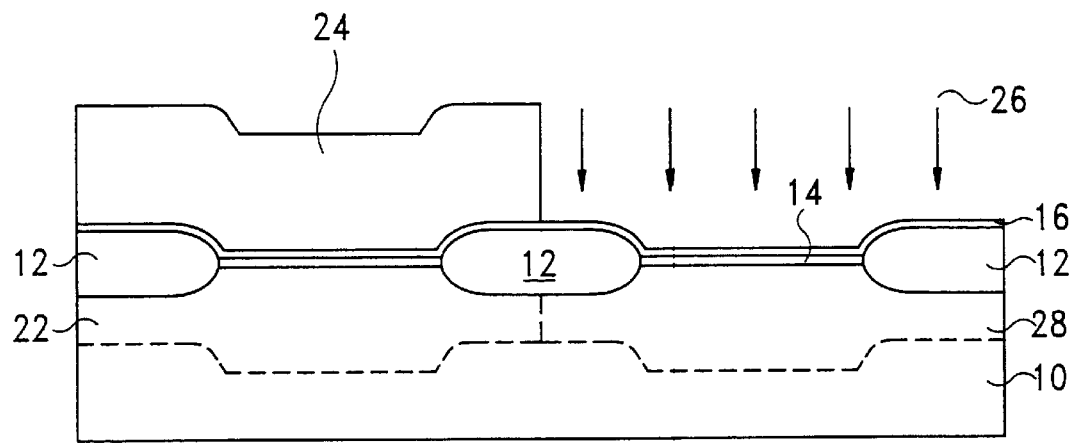

Turning to FIG. 3, a N-well 28 is formed in the substrate 10 adjacent to the P-well 22 using a conventional phosphorous ion implant 26. The N-well 28 is formed as follows. First, an oxide layer 24 is formed over the P-well 22 and then the photoresist layer 18 is removed. Second, the phosphorus ion implantion 26 is performed to form the N-well 28 and the oxide layer 24 serves as an implant mask. An oxide layer 24 is formed over the P-well 22 using a liquid-phase deposition (LPD) process. More specifically, this LPD oxide layer 24 is formed at room temperature by reacting super-saturated hydrofluosilicic acid ($H_2SiF_6$) solution with water. The following equations are believed to describe the LPD-oxide film deposition:

$$H_2SiF_6 + 2H_2O \leftarrow\rightarrow 6HF + SiO_2 \qquad (1)$$

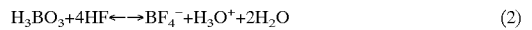

$$H_3BO_3 + 4HF \leftarrow\rightarrow BF_4^- + H_3O^+ + 2H_2O \qquad (2)$$

Figure 4:
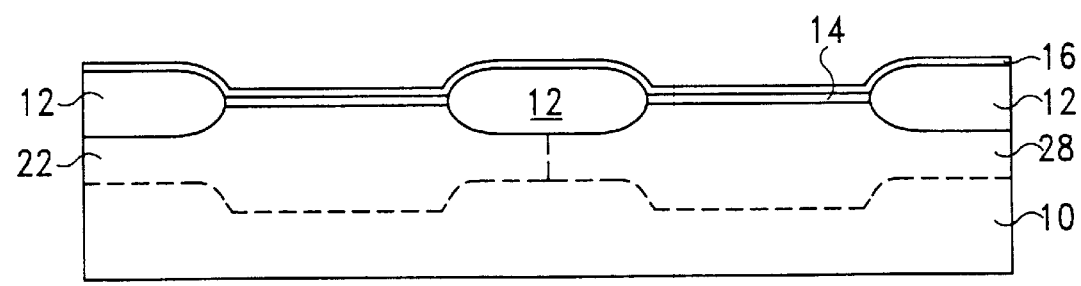

Equation 1 describes the reaction of hydrofluosilicic acid with water to form silicon dioxide and hydrofluoric acid (HF). As shown in equation 2, hydrofluoric acid produced in reaction of equation 1 is consumed by boric acid ($H_3BO_3$), producing water, thereby helping to drive the reaction of equation 1 in the forward direction to produce more oxide. The LPD oxide film deposition occurs as these reactions proceed. After the LPD oxide layer is formed to a thickness of about 5000–20000 angstroms, the reactions are stopped and the photoresist layer 18 is removed. Because the LPD oxide will not adhere to the photoresist as long as the thickness of the LPD oxide is lower than photoresist thickness, the LPD oxide is not formed on the photoresist-mask. The LPD oxide layer 24 thus defines the N-well region 28 and serves as an implant mask. The phosphorus ion implantation 26 is then performed using a dose of about $1\times10^{11}$–$5\times10^{13}$ ions/cm$^2$ and implant energy of about 800–3000 KeV. Thereafter, the LPD oxide layer 24 is removed by using HF or buffer oxide etching (BOE) solution. The resulting structure is shown in FIG. 4.

Figure 5:
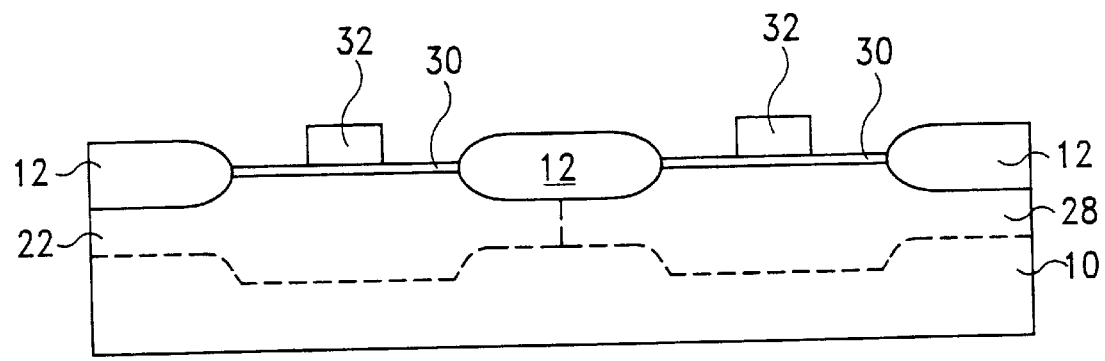

FIG. 5 illustrates a next stage of this embodiment of the present invention. The silicon nitride layer 16 and the oxide layer 14 are removed using standard conventional methods such as wet etching or dry etching. Then, a thin gate oxide 30 is regrown on the substrate 10 between the FOX regions 12 to a thickness of approximately 25–200 angstroms. In this embodiment, the thin gate oxide 30 is formed by using oxidation including dry $O_2$, wet $O_2$, or $N_2+O_2$ ambient or any suitable oxide chemical vapor deposition process.

Afterwards, an undoped polysilicon layer is formed over the FOX regions 12 and the gate oxide 30. In this embodiment, the undoped polysilicon layer is deposited by using a conventional low pressure chemical vapor deposition (LPCVD) method. The thickness of the polysilicon layer is about 1000–1500 angstroms, although any thickness in the range of about 500–3000 angstroms can be used. This undoped polysilicon layer is then patterned and etched to form gate-structures 32 over the P-well 22 and N-well 28 using standard conventional photolithographic techniques. More specifically, a third photoresist layer is formed over the polysilicon layer, which is then patterned to define the gate-structures 32. The undoped polysilicon layer is then etched using the patterned photoresist layer as a mask. In this embodiment, a plasma etch process with a $SF_6/O_2$ etchant is used. Using this process, an etch rate of about 400–680 nm/min with a 300/1 polysilicon selectivity over silicon dioxide can be achieved. The thin gate oxide 30 is used here as an etching stop layer. Thus, the polysilicon gate-structures 32 are formed on the P-well 22 and the N-well 28. The resulting structure is shown in FIG. 5.

Figure 6:
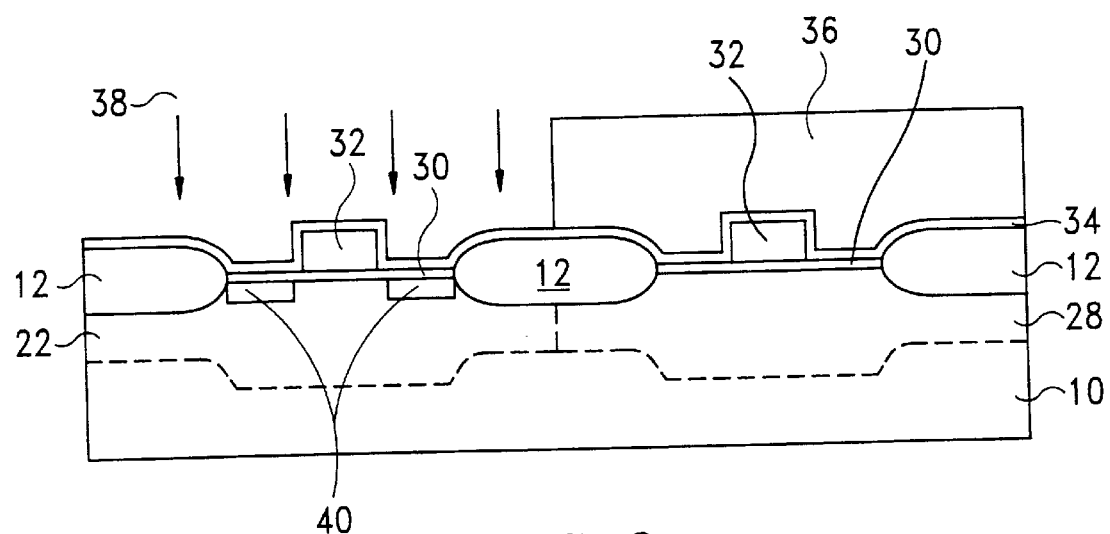

Referring to FIG. 6, a thin undoped amorphous Si layer 34 is deposited over the FOX regions 12, the gate oxide 30, and polysilicon gate-structures 32. In this embodiment, the thin undoped amorphous Si layer 34 is deposited to a thickness of about 200–1000 angstroms using a LPCVD process or an ultra high vacuum (UHV)-CVD process. A fourth photoresist layer is formed over the thin undoped amorphous Si layer 34. The fourth photoresist layer is then patterned and etched to form a fourth photoresist-mask 36 covering the N-well 28. Thereafter, n⁻ lightly doped drain (N-LDD) regions 40 are formed under the gate oxide 30 in the P-well region 22 by a conventional ion implant 38 method. In addition to the photoresist-mask 36, the polysilicon gate-structure 32 and the portions of the thin undoped amorphous Si layer 34 on the sidewalls of the gate-structure 32 serve as an implant mask. In this embodiment, the N-LDD regions 40 are formed by implanting phosphorus dopant having dose of about $5\times10^{12}$–$2\times10^{14}$ ions/cm² and implant energy of about 10–100 KeV. The resulting structure is shown in FIG. 6.

Figure 7:
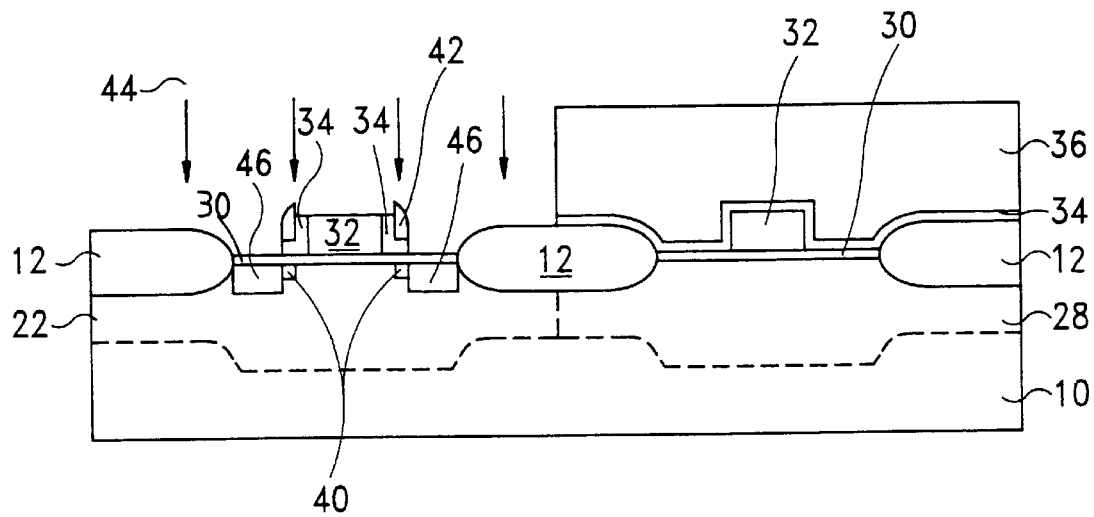

Referring now to FIG. 7, a thin conformal LPD oxide layer is deposited on the thin undoped amorphous Si layer 34 by using the aforementioned LPD process. This LPD oxide layer has a nominal thickness of about 500–2000 angstroms, although any thickness in the range of 500–3000 angstroms can be used. Next, an anisotropic etch process, such as a reactive ion etch (RIE) process, is used to etch back the LPD oxide layer left uncovered by the photoresist-mask 36 in order to oxide spacers. The anisotropic etch process is a high selectivity oxide-to-poly etch of the LPD oxide using the amorphous Si layer 34 as an etch stop. As a result, oxide spacers 42 are formed on the residual portions of the thin undoped amorphous Si layer 34 adjacent to the sidewalls of the gate-structure 32 on the P-well 22. An anisotropic etch process, such as a reactive ion etch (RIE) process, is used to remove the amorphous Si layer 34 left uncovered by the photoresist-mask 36. This anisotropic etch process is a high selectivity poly-to-oxide etch of the amorphous Si 34 using the gate oxide 30 as an etch stop. After these two etching steps are performed, then the segment of amorphous Si layer 34 on the top of the gate 32 should be etched away too, leaving the oxide spacer 42 extending up higher than the top surface of gate 32. The length of bottom of the oxide spacers 42 is in the range of 500–2000 angstroms.

Moreover, along each sidewall of the gate-structure 32 on the P-well 22, the residual portions of the thin undoped amorphous Si layer 34 have a vertical portion along the sidewall of the polysilicon gate-structure 32 and a small horizontal portion on the gate oxide 30, extending outwardly from the sidewall of the polysilicon gatestructure 32. The polysilicon gate-structure 32 and the residual portions of the thin undoped amorphous Si layer 34 form an inverse-T gate electrode for a N-channel metal-oxide-semiconductor (NMOS) device to be formed on the P-well 22.

Afterward, an ion implant 44 is performed to form n+ heavily-doped source/drain (SID) regions 46, using the fourth photoresist-mask 36, the FOX regions 12, the polysilicon gate-structure 32, the residual portions of the thin undoped amorphous Si layer 34, and the spacers 42 as an implant mask. In this embodiment, the ion implant 46 uses arsenic dopants with dose of about $1\times10^{15}$–$5\times10^{16}$ ions/cm² and an implant energy of about 10–80 KeV.

Figure 8:
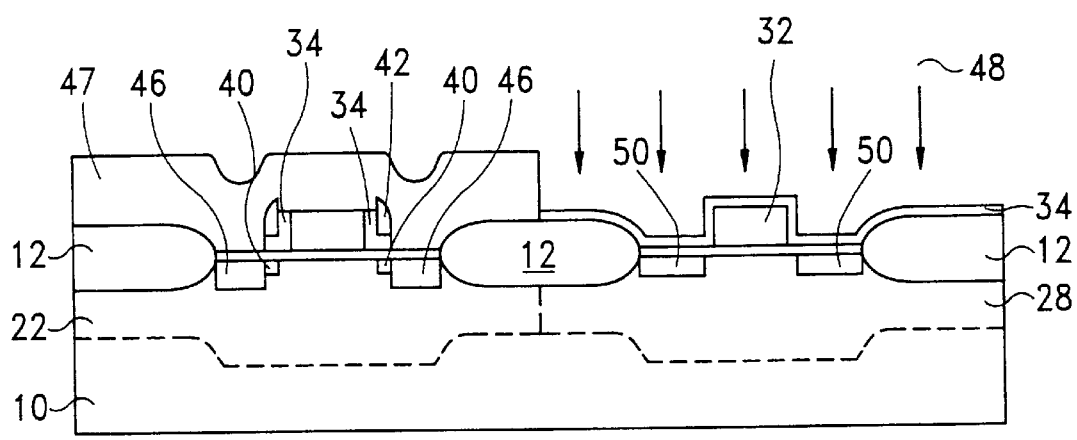

Referring to FIG. 8, a LPD oxide layer 47 is then formed over the P-well 22 using the aforementioned LPD process, thereby covering the polysilicon gate-structure 32, the residual portions of the polysilicon layer 34 and the exposed portions of the gate oxide 30 and FOX regions 12. In this embodiment, the thickness of the LPD oxide layer 47 is about 2000–5000 angstroms. The photoresist layer 36 on the N-well 28 is then removed using standard methods, leaving the LPD oxide layer 47 intact. Next, p⁻ lightly doped drain (P-LDD) regions 50 are formed under the gate oxide 30 in the N-well 28 using a conventional ion implant 48. In this embodiment, the ion implant 48 uses boron dopants at dosage of about $5\times10^{12}$–$2\times10^{14}$ ions/cm² and an implant energy of about 5–50 KeV. Alternatively, $BF_2^+$ dopants at dosage of about $5\times10^{12}$–$2\times10^{14}$ ions/cm² and implant energy of about 20–100 KeV can be used. The LPD oxide layer 47, the now uncovered polysilicon layer 34 and polysilicon gate-structure 32 over the N-well 28 serves as the implant mask layer. Consequently, the P-LDD regions 50 are aligned with the sidewalls of the polysilicon layer 34 on the N-well 28. The resulting structure is shown in the FIG. 8.

Figure 9:
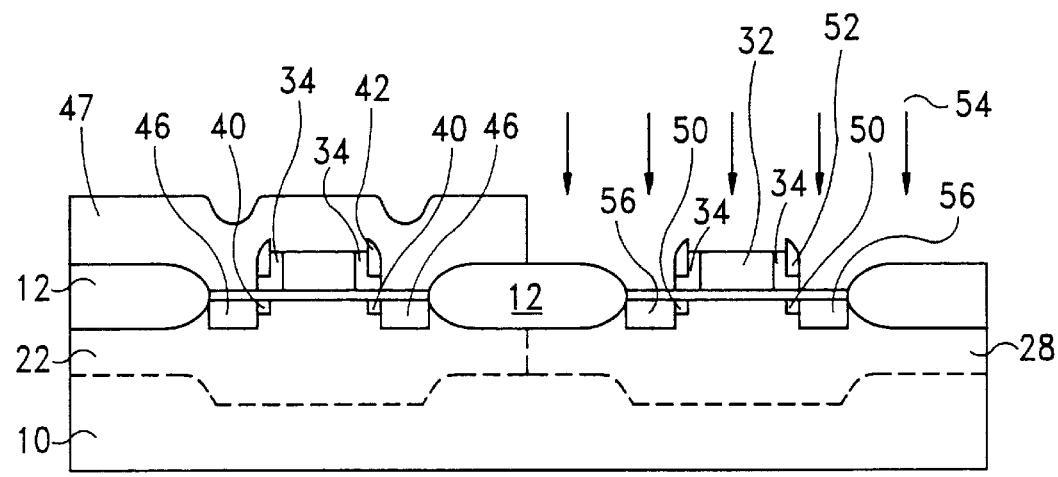

FIG. 9 shows a next stage in formation of a CMOS structure according to this embodiment of the present invention. A LPD oxide layer is formed on the amorphous Si layer 34 on the N-well 28, using the aforementioned LPD process. Next, an anisotropic etch process, such as an RIE process, is used to etch back the LPD oxide layer left on the P-well 22 in order to form oxide spacers. The anisotropic etch process is a high selectivity oxide-to-poly etch of the LPD oxide using the poly 34 as an etch stop. As a result, oxide spacers 52 are formed on the residual portions of the polysilicon layer 34 adjacent to the sidewalls of the gate-structure 32 on the N-well 28. An anisotropic etch process, such as an RIE process, is then used to remove the amorphous Si layer 34 left on the P-well 22. This anisotropic etch process is a high selectivity poly-to-oxide etch ofthe poly 34 using the gate oxide 30 as an etch stop. After that, the segment of amorphous Si layer 34 on the top of the gate 32 should be etched away too, leaving the oxide spacer 52 extending up higher than the top surface of gate 32.

Along each sidewall of the gate-structure 32 on the N-well 28, the residual portions of the polysilicon layer 34 have a vertical portion along the sidewall of the polysilicon gate-structure 32 and a small horizontal portion on the gate oxide 30, extending outwardly from the sidewall of the polysilicon gate-structure 32. The polysilicon gate-structure 32 and the residual portions of the polysilicon layer 34 form an inverse-T gate electrode for a P-channel metal-oxide-semiconductor (PMOS) device to be formed on the N-well 28.

Afterward, an ion implant 54 is performed to form p⁺ heavily-doped S/D regions 56 in the N-well 28, using the FOX regions 12, the polysilicon gate-structure 32, the residual portions of the thin undoped amorphous Si layer 34, and the spacers 52 on the N-well region 28, in addition to the LPD oxide layer 47 over the P-well 22, as an implant mask. In this embodiment, the ion implant 54 uses $BF_2^+$ dopants with dosage of about $1\times10^{15}$–$5\times10^{16}$ ions/cm² and an implant energy of about 10–80 KeV. Thus, the heavily doped p⁺ S/D regions 56 are aligned with the spacers 52.

Figure 10:
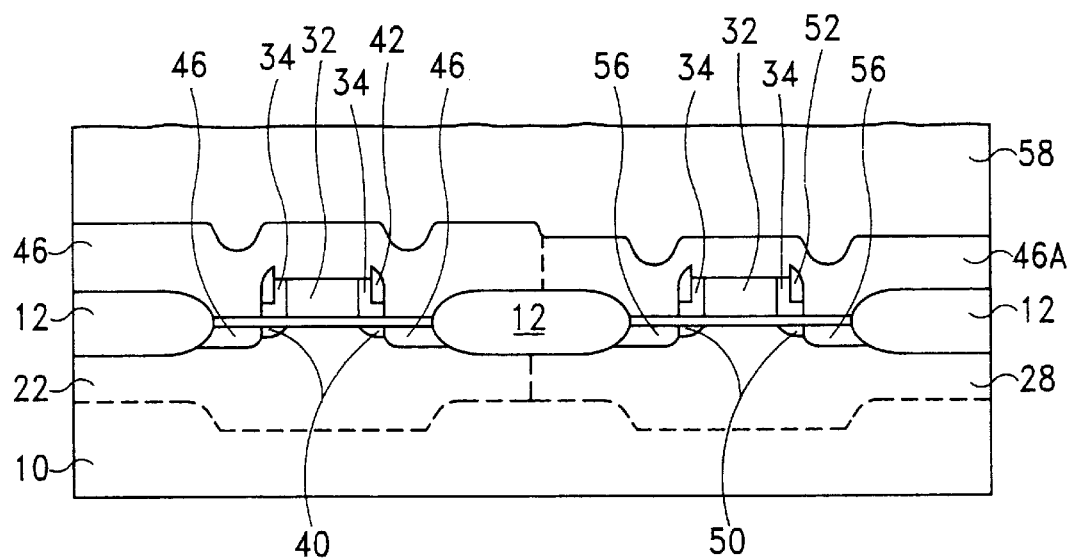

Referring to FIG. 10, a LPD oxide layer 46A is then formed over the N-well 28 using the aforementioned LPD process. The thickness of the LPD oxide layer 46A is about 2000–5000 angstroms, but slightly thinner than the LPD oxide layer 46. Thus, a small step exists where the LPD oxide layer 46 abuts the LPD oxide layer 46A. A dielectric layer 58 is then formed on the LPD oxide layers 46 and 46A. In this embodiment, the dielectric layer 58 is a borophosphosilicate glass (BPSG) layer, deposited using any suitable process such as LPCVD or atmospheric pressure chemical vapor deposition (APCVD) to a thickness of about 3000–20000 angstroms. Afterwards, a thermal process of about 600°–800° C. is performed to reflow the BPSG layer 58 and activate the S/D junctions. The reflow process planarizes the BPSG layer 58 to improve the topography for subsequent photolithography steps. The resulting structure is shown in FIG. 10.

Figure 11:
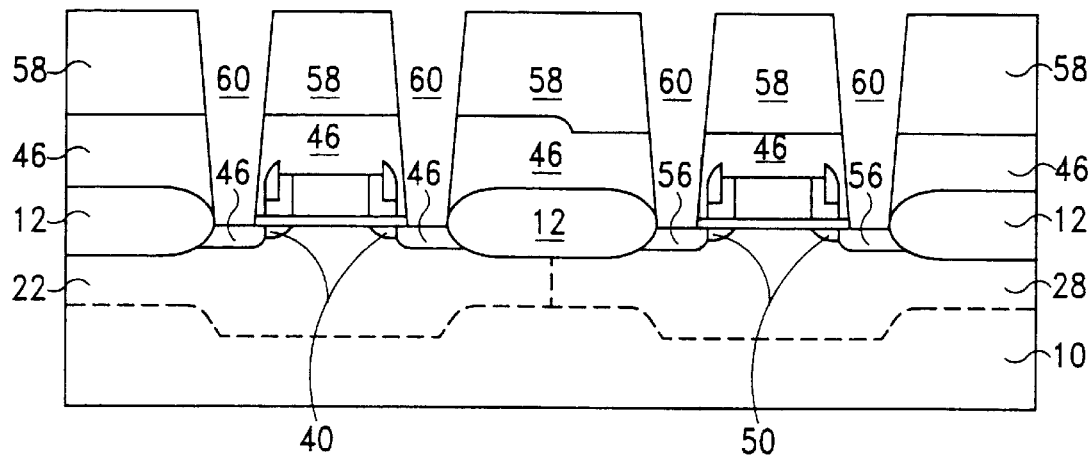

Referring now to FIG. 11, a fifth photoresist-mask is formed to define contact holes 60 aligned with the S/D regions of the NMOS and PMOS devices. Then, an etching process is performed to etch through the BPSG layer 58 and the LPD oxide layers 46 and 46A and expose portions of the S/D regions form the contact holes 60. In this embodiment, a standard RIE oxide etching process is used to form the contact holes 60.

Figure 12:
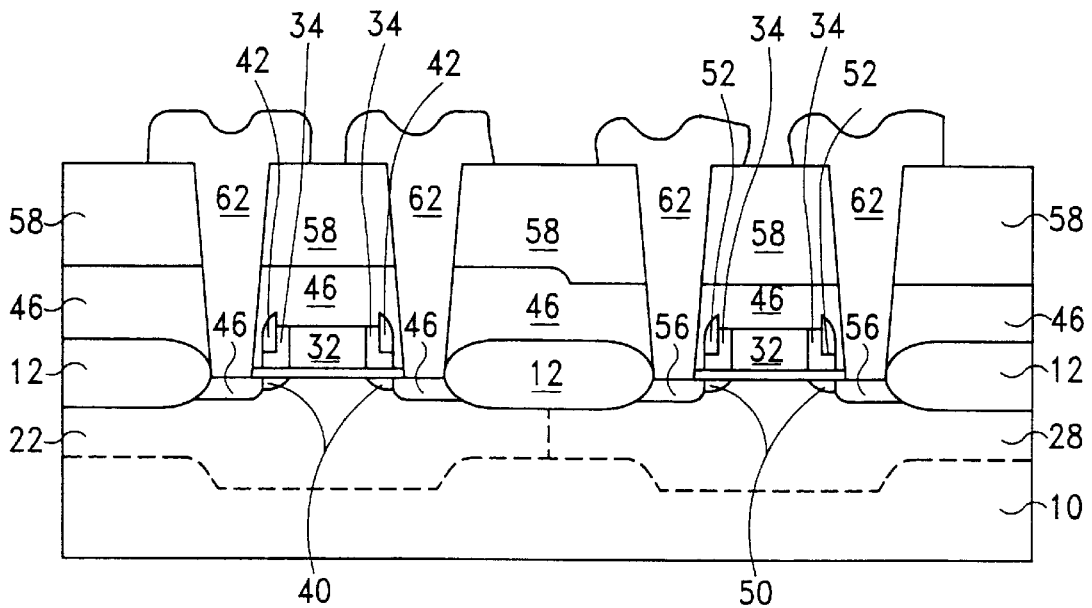

FIG. 12 shows the final stage of one embodiment of the present invention. A conductive layer 62 is formed on the BPSG layer 58 and fully fills in the contact holes 60 (FIG. 11). In this embodiment, the conductive layer 62 is an aluminum alloy deposited using a standard sputtering process to a thickness of about 3000–20000 angstroms. Of course, in other embodiments, the conductive layer 62 may be any suitable conductive material, such as a metal stack layer or silicide layer.

Then a sixth photoresist layer is formed on the conductive layer 62. The sixth photoresist layer is then patterned to define contacts and interconnect structures on the conductive layer 62 using standard photolithography processes. After the sixth photoresist layer is patterned, a standard RIE etching process is performed to remove the portions of the conductive layer 62 which are uncovered by the patterned photoresist layer.

As described above, a CMOS device according to the present invention requires only six photoresist-masks, unlike the nine or ten photoresist-masks required in conventional CMOS processes. The reduced photoresist-mask count simplifies the process and decreases the alignment problems that can occur in high mask count processes. In addition, the use of LPD oxide processes helps achieve a low thermal budget. Further, the inverse-T gate-structure reduces channel hot carrier degradation due to the full drain-to-gate overlap provided by the inverse-T gate-structure.

Although specific embodiments including the preferred embodiment have been illustrated and described, it will be appreciated by those skilled in the art that various modifications may be made without departing from the spirit and scope of the present invention which is intended to be limited solely by the appended claims.

The embodiments of the invention in which an exclusive property or privilege is claimed are defined as follows:

1. A method for fabricating a complementary metal-oxide-semiconductor CMOS device with an inverse-T gate LDD structure, the method comprising:

forming a first photoresist-mask over a substrate, wherein said first photoresist-mask leaves uncovered portions of said substrate defining a first field oxide (FOX) region, a second FOX region and a third FOX region;

forming said first field oxide (FOX) region, said second FOX region and said third FOX region in and on said portions of said substrate left uncovered by said first photoresist-mask removing said first photoresist-mask;

forming a first oxide layer on said substrate and between said field oxide regions;

forming a first dielectric layer over said first gate oxide layer and on said field oxide regions;

forming a second photoresist-mask over said substrate, wherein said second photoresist-mask covers a portion of said substrate between said second and third FOX regions and does not cover a portion of said substrate between said first and second FOX regions;

forming a first conductivity-well region in said portion of said substrate left uncovered by said second photoresist-mask;

forming a second dielectric layer over said portion of said substrate left uncovered by said second photoresist-mask;

removing said second photoresist-mask while leaving said second dielectric layer intact;

forming a second conductivity-well region in a portion of said substrate left uncovered by said second dielectric layer;

removing said second dielectric layer;

removing said first dielectric layer;

removing said first oxide layer;

forming a second oxide layer on said substrate and between said field oxide regions;

forming a first conductive layer over said second oxide layer;

forming a third photoresist-mask over said first conductive layer, wherein said third photoresist-mask covers portions of said first conductive layer defining a first gate-structure over said first conductivity-well region and a second gate-structure over said second conductivity-well region;

a removing portions of said first conductive layer uncovered by said third photoresist-mask;

conformally forming a second conductive layer on said first and second gate-structures, wherein portions of said second conductive layer are on sidewalls of said first and second gate-structures;

forming a fourth photoresist-mask over said second conductive layer, wherein said fourth photoresist-mask covers said second conductivity-well region;

forming second conductivity-lightly-doped source/drain regions in portions of said first conductivity-well region that are not covered by said first gate-structure, said portions of said second conductive layer on said sidewalls of said first gate-structure, and said first and second FOX regions;

forming a third dielectric layer over said second conductive layer;

removing portions of said third dielectric layer and said second conductive layer to form first spacers on said sidewalls of said first gate-structure;

forming second conductivity heavily-doped source/drain regions in portions of said first conductivity-well region that are not covered by said first gate-structure, said first spacers and said first and second FOX regions;

forming a fourth dielectric layer over a portion of said substrate not covered by said fourth photoresist-mask, wherein said first conductivity-well region is covered by said fourth dielectric layer;

removing said fourth photoresist-mask while leaving said fourth dielectric layer intact;

forming first conductivity-lightly-doped source/drain regions in portions of said second conductivity-well region that are not covered by said second gate-structure, said portions of said second conductive layer on said sidewalls of said second gate-structure, and said second and third FOX regions;

forming a fifth dielectric layer over a portion of said second conductive layer covering said second gate-structure;

removing portions of said fifth dielectric layer and said second conductive layer to form second spacers on said sidewalls of said second gate-structure;

forming first conductivity heavily-doped source/drain regions in portions of said second conductivity-well region that are not covered by said second gate-structure, said second spacers and said second and third FOX regions;

forming a sixth dielectric layer on a portion of said substrate not covered by said fourth dielectric layer, wherein said second conductivity-well region is covered by said sixth dielectric layer;

forming a seventh dielectric layer on said sixth dielectric layer and said fourth dielectric layer;

planarizing said seventh dielectric layer;

forming a fifth photoresist-mask over said seventh dielectric layer, wherein portions of said seventh dielectric layer left uncovered by said fifth photoresist-mask define contact windows;

removing portions of said second oxide layer, said fourth dielectric layer, said sixth dielectric layer and said seventh dielectric layer not covered by said fifth photoresist-mask to form contact holes;

forming a third conductive layer on said seventh dielectric layer and in said contact holes;

forming a sixth photoresist-mask over said third conductive layer, wherein portions of said third conductive layer covered by said sixth photoresist-mask define contacts; and removing portions of said third conductive layer not covered by said sixth photoresist-mask.

2. The method according to claim 1, wherein said first dielectric layer comprises a nitride layer.

3. The method according to claim 1, wherein said first conductivity-well region is formed by ion implantation of boron.

4. The method according to claim 3, wherein said ion implantation of boron comprises implantation with a dosage of about $1\times10^{11}$–$5\times10^{13}$ ions/cm$^2$ and an implant energy of about 500 KeV–3000 KeV.

5. The method according to claim 1, wherein said second dielectric layer comprises an oxide layer formed using a liquid phase deposition (LPD) process.

6. The method according to claim 5, wherein said LPD process comprises reacting supersaturated hydrofluosilicic acid (H$_2$SiF$_6$) with water at room temperature.

7. The method according to claim 1, wherein said second conductivity-well region is formed by ion implantation of phosphorus.

8. The method according to claim 7, wherein said phosphorus is implanted with dosage of about $1\times10^{11}$–$5\times10^{13}$ ions/cm$^2$ and an implant energy of about 800 KeV–3000 KeV.

9. The method according to claim 1, wherein said second oxide layer has a thickness of about 25–200 angstroms.

10. The method according to claim 1, wherein said first conductive layer comprises a polysilicon layer.

11. The method according to claim 10, wherein said first conductive layer is formed using a low pressure chemical vapor deposition process to a thickness of about 500–2000 angstroms.

12. The method according to claim 1, wherein said second conductive layer comprises an amorphous silicon layer.

13. The method according to claim 12, wherein said second conductive layer is formed using a low pressure chemical vapor deposition process to a thickness of about 200–1000 angstroms.

14. The method according to claim 1, wherein removing portions of said first conductive layer comprises etching said first conductive layer using a process with a high selectivity ratio.

15. The method according to claim 1, wherein said second conductivity-lightly-doped source/drain regions are formed by ion implantation of phosphorus dopants.

16. The method according to claim 15, wherein said phosphorus dopants are implanted using a dosage of about $5\times10^{12}$–$2\times10^{14}$ ions/cm$^2$ and an implant energy of about 10–100 KeV.

17. The method according to claim 6, wherein said third dielectric layer comprises an oxide layer having a thickness of about 300–1000 angstroms formed using said LPD process.

18. The method according to claim 1, wherein forming said second conductivity heavily-doped source/drain regions comprises ion implanting arsenic using a dosage of about $1\times10^{15}$–$5\times10^{16}$ ions/cm$^2$ and an implant energy of about 10–80 KeV.

19. The method according to claim 6, wherein said fourth dielectric layer comprises an oxide layer having a thickness of about 2000–5000 angstroms formed using said LPD process.

20. The method according to claim 1, wherein forming said first conductivity-lightly-doped source/drain regions comprises ion implanting boron using a dosage of about $5\times10^{12}$–$1\times10^{14}$ ions/cm$^2$ and an implant energy of about 10–30 KeV.

21. The method according to claim 6, wherein said fifth dielectric layer comprises an oxide layer having a thickness of about 300–1000 angstroms formed using said LPD process.

22. The method according to claim 1, wherein forming said first conductivity heavily-doped source/drain regions comprises ion implanting BF$_2^+$ dopants using dosage of about $1\times10^{15}$–$5\times10^{16}$ ions/cm$^2$ and an implant energy of about 10–80 KeV.

23. The method according to claim 6, wherein said sixth dielectric layer comprises an oxide layer having a thickness of about 2000–5000 angstroms formed using said LPD process.

24. The method according to claim 1, wherein said seventh dielectric layer comprises a borophosphosilicate glass (BPSG) layer.

25. The method according to claim 24, wherein planarizing said seventh dielectric layer comprises using a thermal process to reflow said BPSG layer.

26. The method according to claim 1, wherein said third conductive layer comprises a polysilicon layer.

27. The method according to claim 1, wherein said third conductive layer comprises a silicide layer.

28. The method according to claim 1, wherein said third conductive layer comprises a metal layer.

29. The method according to claim 1, wherein no additional photoresist masks are formed.

30. The method according to claim 1, wherein removing portions of said third dielectric layer and said second conductive layer to form first spacers on said sidewalls of said first gate-structure leaves residual portions of said second conductive layer on said second oxide layer and extending from said sidewalls of said first gate-structure, said residual portions and said first gate-structure forming an inverse-T gate electrode.

31. A method for fabricating a complementary metal-oxide-semiconductor CMOS device with no more than six photoresist-masks, the method comprising:

forming field oxide regions in a substrate using a first photoresist-mask to define said field oxide regions;

forming a first dielectric layer over said substrate;

forming a first conductivity-well region in a portion of said substrate using a second photoresist-mask as an implant mask;

forming a second dielectric layer over said first conductivity-well region, said second dielectric layer including no photoresist material;

removing said second photoresist-mask while leaving said second dielectric layer intact;

forming a second conductivity-well region in a portion of said substrate using said second dielectric layer as an implant mask;

removing said second dielectric layer and said first dielectric layer;

forming a gate oxide layer;

forming a first conductive layer over said gate oxide layer;

forming first gate-structure over said first conductivity-well region and a second gate-structure over said second conductivity-well region using a third photoresist-mask as an etching mask;

forming second conductivity source/drain regions in portions of said first conductivity-well region using a fourth photoresist-mask covering said second conductivity-well region as an implant mask;

forming a fourth dielectric layer over first conductivity-well region;

removing said fourth photoresist-mask while leaving said fourth dielectric layer intact;

forming first conductivity source/drain regions in portions of said second conductivity-well region using said fourth dielectric layer as an implant mask;

forming a fifth dielectric layer over said second conductivity-well region, wherein said first and second conductivity-well regions are fully covered;

forming a sixth dielectric layer over said fourth and fifth dielectric layers forming contact holes through said fourth, fifth and sixth dielectric layers using a fifth photoresist-mask as an etching mask;

forming a third conductive layer on said sixth dielectric layer and in said contact holes; and forming contacts from said third conductive layer using a sixth photoresist-mask as an etching mask.

32. The method according to claim 31, wherein said second, third, fourth and fifth dielectric layers are formed using a liquid phase deposition (LPD) process.

33. The method according to claim 32, wherein said LPD process comprises reacting supersaturated hydrofluosilicic acid ($H_2SiF_6$) with water at room temperature.

34. The method according to claim 32, wherein said source/drain regions include a lightly-doped drain (LDD) doping profile.

35. The method according to claim 32, wherein said gate structure forms part of an inverse-T gate electrode.

* * * * *